US008993399B2

(12) United States Patent
Cheng et al.

(10) Patent No.: US 8,993,399 B2
(45) Date of Patent: Mar. 31, 2015

(54) FINFET STRUCTURES HAVING SILICON GERMANIUM AND SILICON FINS

(71) Applicant: International Business Machines Corporation, Armonk, NY (US)

(72) Inventors: Kangguo Cheng, Schenectady, NY (US); Bruce B. Doris, Slinerlands, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 13/896,930

(22) Filed: May 17, 2013

(65) Prior Publication Data
US 2014/0339643 A1  Nov. 20, 2014

(51) Int. Cl.
| H01L 21/336 | (2006.01) |
| H01L 21/8238 | (2006.01) |
| H01L 21/762 | (2006.01) |
| H01L 27/088 | (2006.01) |

(52) U.S. Cl.
CPC .. *H01L 21/823821* (2013.01); *H01L 21/76224* (2013.01); *H01L 27/0886* (2013.01)
USPC .......................................... 438/268; 438/296

(58) Field of Classification Search
CPC ................... H01L 21/76283; H01L 21/76289
USPC .................................................. 438/268, 296
See application file for complete search history.

(56) References Cited

U.S. PATENT DOCUMENTS

| 7,101,763 B1 | 9/2006 | Anderson et al. |
| 7,674,669 B2 | 3/2010 | Hanafi |
| 7,855,105 B1 | 12/2010 | Jaganathan et al. |
| 8,138,543 B2 | 3/2012 | Cheng et al. |
| 8,169,025 B2 | 5/2012 | Bedell et al. |
| 8,183,627 B2* | 5/2012 | Currie ........................ 257/329 |
| 2005/0191795 A1* | 9/2005 | Chidambarrao et al. ..... 438/142 |
| 2012/0068264 A1 | 3/2012 | Cheng et al. |
| 2013/0005106 A1 | 1/2013 | Tezuka et al. |
| 2013/0161693 A1* | 6/2013 | Adam et al. .................. 257/192 |
| 2013/0244387 A1* | 9/2013 | Cho .............................. 438/283 |

OTHER PUBLICATIONS

I. Ok et al., "Strained SiGe and Si FinFETs for high performance logic with SiGe/Si stack on SOI," 2010 IEEE International Electron Devices Meeting (IEDM), Dec. 6-8, 2010, pp. 34.2.1-34.2.4.
S. L. Wu et al., "Enhanced CMOS performances using substrate strained-SiGe and mechanical strained-Si technology," IEEE Electron Device Letters, vol. 27, Issue 1, Jan. 2006, pp. 46-48.
K. Cheng et al., "Semiconductor Alloy Fin Field Effect Transistor," U.S. Appl. No. 13/644,742, filed Oct. 4, 2012.

* cited by examiner

*Primary Examiner* — Kevin Parendo
(74) *Attorney, Agent, or Firm* — Daniel P. Morris; Otterstedt, Ellenbogen & Kammer, LLP

(57) ABSTRACT

A finned structure is fabricated using a bulk silicon substrate having a carbon doped epitaxial silicon layer. A pFET region of the structure includes silicon germanium fins. Such fins are formed by annealing the structure to mix a germanium containing layer with an adjoining crystalline silicon layer. The structure further includes an nFET region including silicon fins formed from the crystalline silicon layer. The germanium containing layer in the nFET region is removed to create a space beneath the crystalline silicon layer in the nFET region. An insulating material is provided within the space. The pFET and nFET regions are electrically isolated by a shallow trench isolation region.

10 Claims, 6 Drawing Sheets

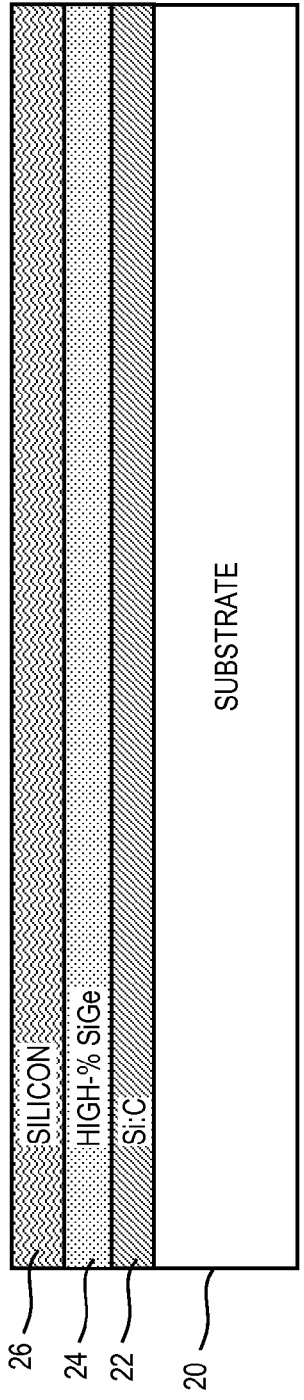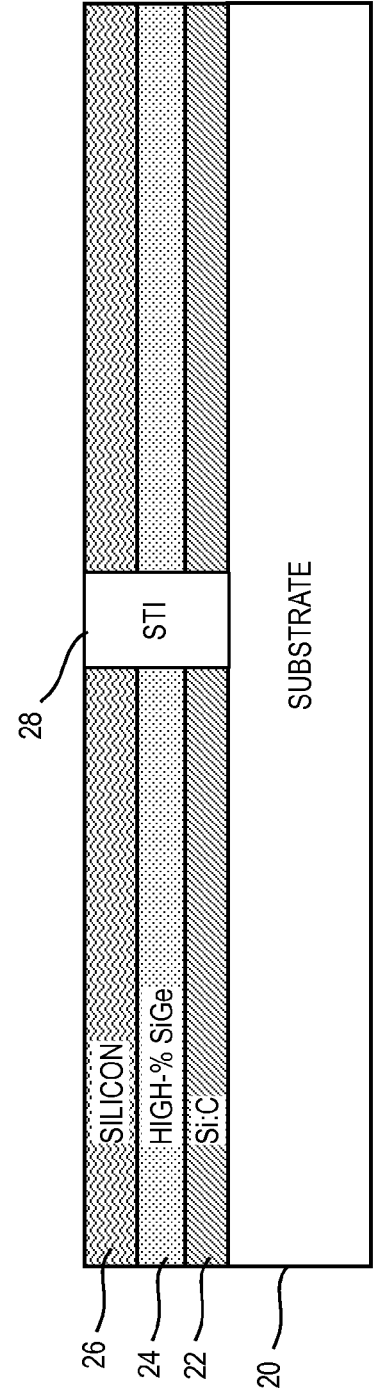

FINFET STRUCTURES HAVING SILICON GERMANIUM AND SILICON FINS

FIELD

The present disclosure relates to the physical sciences, and, more particularly, to fin-type field effect transistor (FinFET) structures and methods of fabrication thereof.

BACKGROUND

Some types of field effect transistors (FETs) have three-dimensional, non-planar configurations including fin-like structures extending above substrates. Such field effect transistors are referred to as FinFETs. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials.

Doped semiconductor material may be provided by selective epitaxial growth on the sidewalls of the fin structure(s) during fabrication of FinFETs. Such growth results in faceted structures that, in some cases, merge into a continuous volume.

SUMMARY

Principles of the present disclosure provide an exemplary fabrication method that includes obtaining a structure comprising a bulk silicon substrate, an epitaxial layer comprising carbon doped silicon on the substrate, an epitaxial layer containing germanium on the carbon doped silicon layer, and a layer comprising crystalline silicon on the germanium containing layer. An isolation region is formed on the structure, electrically isolating a first region of the structure from a second region of the structure. The method further includes removing the germanium containing layer from the second region of the structure, thereby forming a space within the second region beneath the crystalline silicon layer, forming an insulating layer within the space, thermally mixing the germanium containing layer and the crystalline silicon layer in the first region of the structure to form a layer comprising silicon germanium, forming a plurality of fins comprising silicon germanium in the first region from the silicon germanium layer, and forming a plurality of fins from the crystalline silicon layer in the second region.

A further exemplary fabrication method includes depositing an epitaxial carbon doped silicon layer on an essentially undoped silicon substrate, depositing an epitaxial silicon germanium layer on the carbon doped silicon layer, and depositing an essentially undoped epitaxial silicon layer on the silicon germanium layer, thereby forming a first structure comprising the silicon substrate, the carbon doped silicon layer, the silicon germanium layer and the epitaxial silicon layer. A shallow trench isolation region is formed within the first structure. The silicon germanium layer on a first side of the shallow trench isolation region is removed, thereby forming a space within the first structure beneath the epitaxial silicon layer. The space is filled with an electrically insulating material. The method further includes the step of thermally mixing the silicon germanium layer and the epitaxial silicon layer on a second side of the shallow trench isolation region, thereby forming a silicon germanium surface layer. A first set of parallel fins is formed from the epitaxial silicon layer on the first side of the shallow trench isolation region and a second set of parallel fins is formed from the silicon germanium surface layer on the second side of the shallow trench isolation region.

A structure in accordance with an exemplary embodiment includes a bulk silicon substrate and an epitaxial carbon doped silicon layer on the bulk silicon substrate. The structure further includes a plurality of fins comprising silicon germanium adjoining a first portion of the epitaxial carbon doped silicon layer. An insulating layer adjoins a second portion of the epitaxial carbon doped silicon layer. A plurality of fins comprising crystalline silicon adjoins the insulating layer. An isolation region electrically isolates the first and second portions of the epitaxial carbon doped silicon layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

FinFET structures and fabrication methods as disclosed herein can provide substantial beneficial technical effects. For example, one or more embodiments may provide one or more of the following advantages:

Enhanced FinFET performance;
Avoidance of defects in fin structures;
Different materials for nFET and pFET fins with uniform fin height (topography);
Different channel materials for nFET and pFET devices so nFET and pFET characteristics can be independently optimized.

These and other features and advantages will become apparent from the following detailed description of illustrative embodiments thereof, which is to be read in connection with the accompanying drawings.

BRIEF DESCRIPTION OF THE DRAWINGS

FIG. 4 is a schematic illustration of the structure of FIG. 3 showing a silicon layer deposited epitaxially on the silicon germanium layer;

FIG. 5 is a schematic illustration showing formation of a shallow trench isolation (STI) region on the substrate shown in FIG. 4;

DETAILED DESCRIPTION

FinFET structures are characterized by fins formed on semiconductor substrates. Such substrates include bulk silicon substrates (fin on bulk) and SOI substrates (fin on SOI) as discussed above. The processes discussed below are applicable to fabrication of FinFET structures from bulk substrates where sets of fins comprising silicon and silicon germanium are desired. FIGS. 1-12 illustrate exemplary steps that may be performed sequentially in fabricating a structure, it being appreciated that additional steps may be necessary depending on the desired features of the structure. Fabrication may commence with a partially completed structure, in which case one or more of the steps described below could be omitted.

Figure 1:
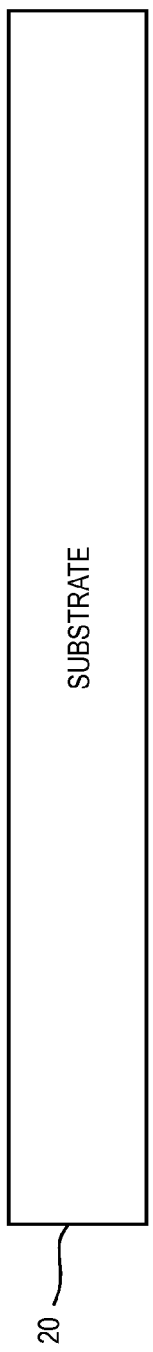
FIG. 1 is a schematic illustration of a bulk silicon substrate.
Figure 2:
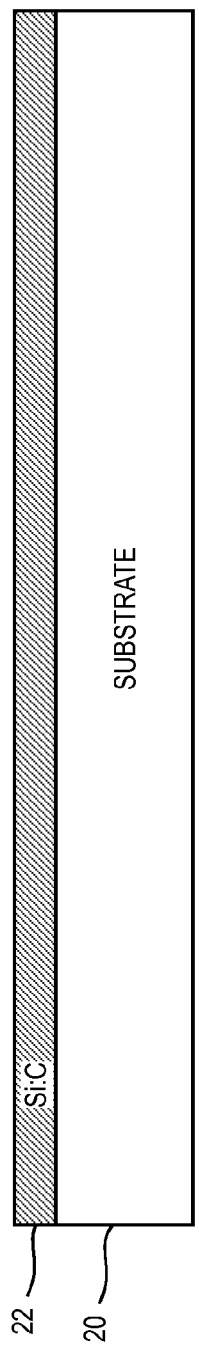
FIG. 2 is a schematic illustration of the substrate of FIG. 1 including a layer of carbon doped silicon formed thereon.

A bulk substrate 20 comprised of essentially undoped crystalline silicon is shown in FIG. 1, it being appreciated that standard silicon substrates may have a very low level of p-doping. The substrate may be in the form of a wafer. Referring to FIG. 2, a carbon doped silicon (Si:C) layer 22 is deposited epitaxially, for example via chemical vapor deposition (CVD), on the substrate 20. Carbon is electrically inactive and prevents the diffusion of germanium into underlying layers. The thickness of the Si:C layer is at least five nanometers (5 nm) in one or more exemplary embodiments. The deposited material has an atomic carbon concentration of between about 0.2-4% substitutional carbon in one or more exemplary embodiments. In other embodiments, the layer 22 has a concentration of about 0.3 to about 2.5% substitutional carbon. It is understood that the total amount of carbon in the carbon doped silicon layer 22 may be higher than the substitutional amount.

Figure 3:
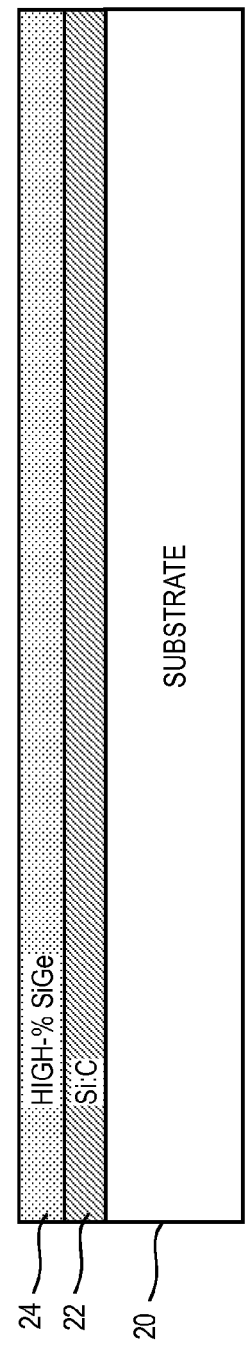
FIG. 3 is a schematic illustration of the structure of FIG. 2 showing a silicon germanium layer deposited on the carbon doped silicon layer.

Referring to FIG. 3, a germanium-containing layer 24, preferably silicon germanium is deposited epitaxially, for example by CVD, on the carbon doped silicon layer 22. In one or more embodiments, the germanium-containing layer comprises 20-99% germanium, though more preferably 20-80% germanium to minimize or avoid potential crystal defects in the resulting structure. In other embodiments, the layer contains 30-60% germanium. The germanium content should be sufficient such that there is high selectivity between the germanium-containing layer and silicon during an etching process to be described below. The thickness of the germanium-containing layer in one or more embodiments is between five to twenty-five nanometers (5-25 nm). As will be appreciated from the discussion below, the germanium-containing layer should have sufficient thickness and sufficient germanium content that fins formed in the pFET region of the resulting structure contain an acceptable ratio of silicon and germanium for pFET applications.

As shown in FIG. 4, an essentially undoped epitaxial silicon layer 26 is formed on the germanium-containing layer 24 by CVD or other suitable process. The thickness of this layer corresponds to the fin height desired for the finished product and is chosen accordingly. In one or more embodiments, the thickness of the epitaxial silicon layer 26 is twenty to thirty nanometers. The epitaxial silicon layer 26 does not contain germanium and is accordingly well suited for nFET applications, as discussed further below.

A shallow trench isolation (STI) region 28 is formed in the structure shown in FIG. 4, resulting in the structure shown in FIG. 5. A trench is formed in the structure, for example by reactive ion etching, down to the substrate 20. Patterning techniques familiar to those skilled in the art facilitate trench formation and subsequent filling of the trench with one or more electrically insulating material(s) such as silicon dioxide. Shallow trench isolation (STI) provides a region 28 that electrically isolates active areas of the structure.

Figure 6:
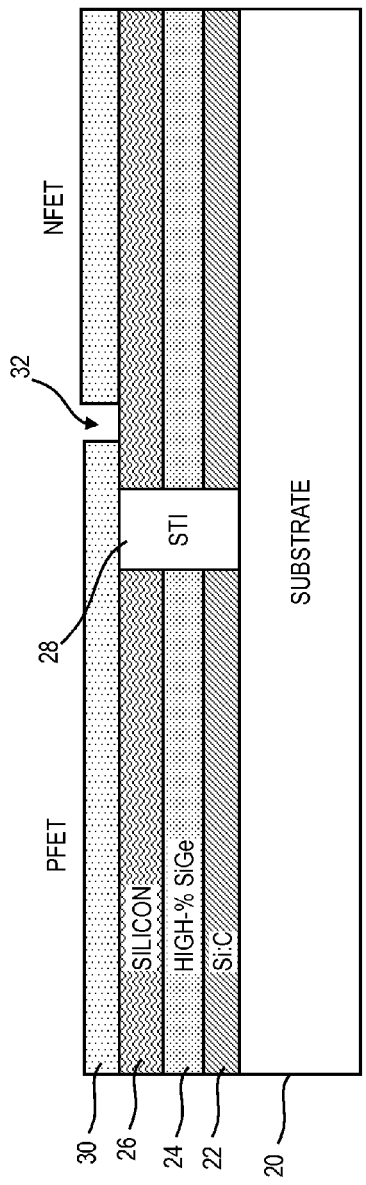
FIG. 6 is a schematic illustration showing formation of a hard mask on the epitaxial silicon layer of the structure of FIG. 5 and the formation of an opening within the hard mask.

Referring to FIG. 6, a hard mask 30 is formed over the silicon layer 26 and STI region 28. A nitride (silicon nitride ($Si_3N_4$)) hard mask is employed in one or more embodiments. Such a mask may be deposited using conventional deposition techniques such as spin-on coating, CVD, plasma-assisted CVD, or other known techniques. Conventional processes are further employed, such as applying and patterning a resist, etching, and removing resist, to remove a portion of the hard mask 30 from the region of the structure to be used as an nFET region. A portion of the silicon layer 26 is accordingly exposed in the nFET region of the structure by a trench 32 formed in the hard mask 30. Hot phosphoric acid is an exemplary etchant that may be employed to form the trench 32 in a nitride hard mask.

Figure 7:
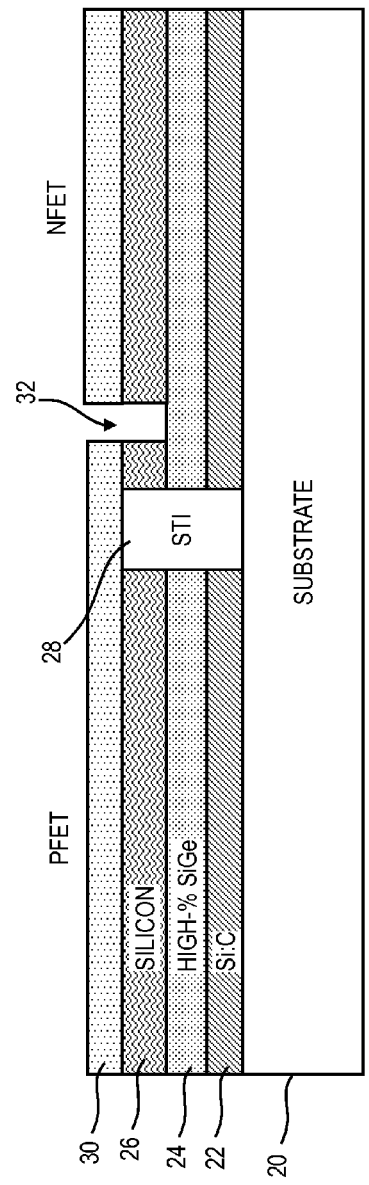
FIG. 7 is a schematic illustration showing removal of a portion of the silicon layer beneath the opening in the hard mask.
Figure 8:
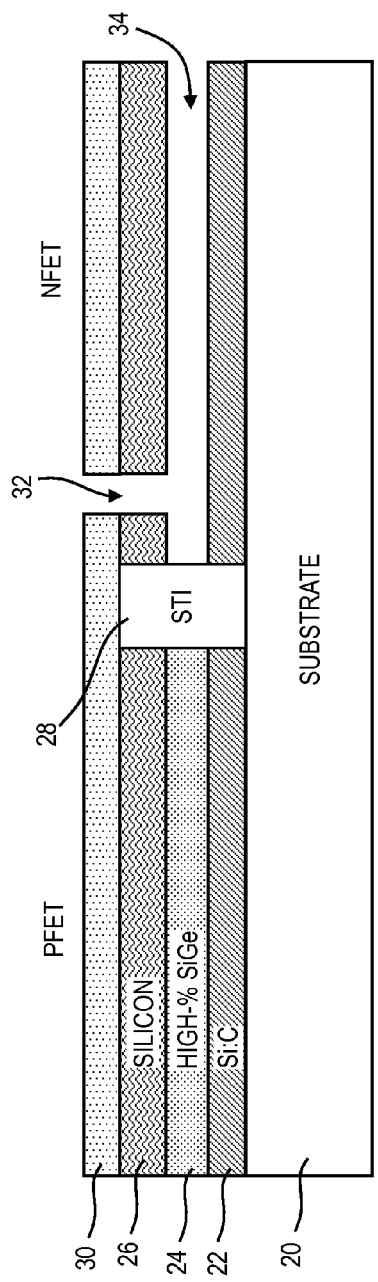
FIG. 8 is a schematic illustration showing removal of a portion of the silicon germanium layer of the structure shown in FIG. 7.

Referring to FIG. 7, the trench 32 is extended down to at least the germanium containing layer 24 and possibly to the carbon doped silicon layer 22. Reactive ion etching (RIE) through the opening in the hard mask 30 is employed in one or more exemplary embodiments to extend the trench 32 so that access to the germanium containing layer 24 can be obtained for further processing.

Once access to the germanium containing layer 24 in the nFET region of the structure is obtained, the germanium containing layer 24 in this region is removed. Such removal creates a tunnel or space 34 between the silicon layer 26 and the carbon doped silicon layer 22 in the nFET region of the structure. A "silicon on nothing" (SON) region is accordingly formed. Selective vapor phase etching using hydrogen chloride (HCl) at high temperature (for example 650-750° C.) is an exemplary technique to form the structure shown in FIG. 8 and can be conducted in the CVD tool employed in one or more of the steps described above. As discussed above, the germanium containing layer 24 should include sufficient germanium such that there is high selectivity between this layer and silicon. A relatively high germanium content in the layer 24 facilitates the etching process. In one exemplary embodiment, the germanium containing layer 24 comprises sixty percent (60%) germanium.

Figure 9:
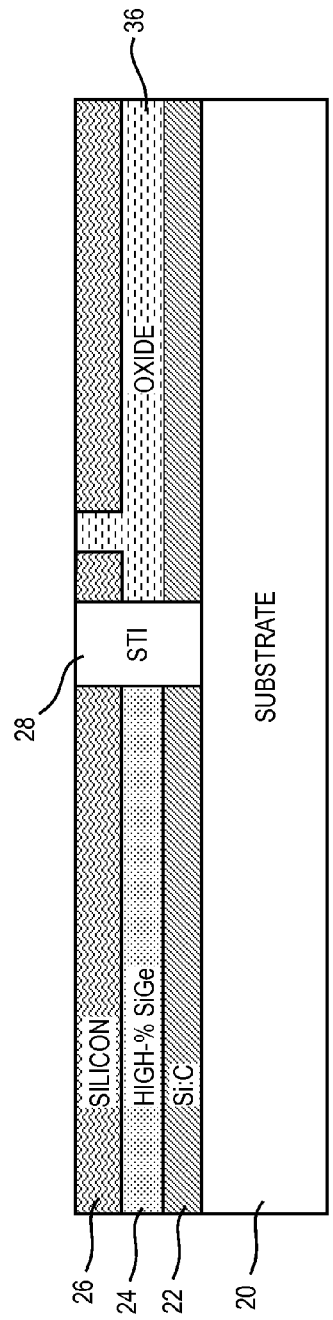
FIG. 9 is a schematic illustration showing removal of the hard mask and filling of the region between the epitaxial silicon and carbon doped silicon layers formerly containing silicon germanium.
Figure 10:
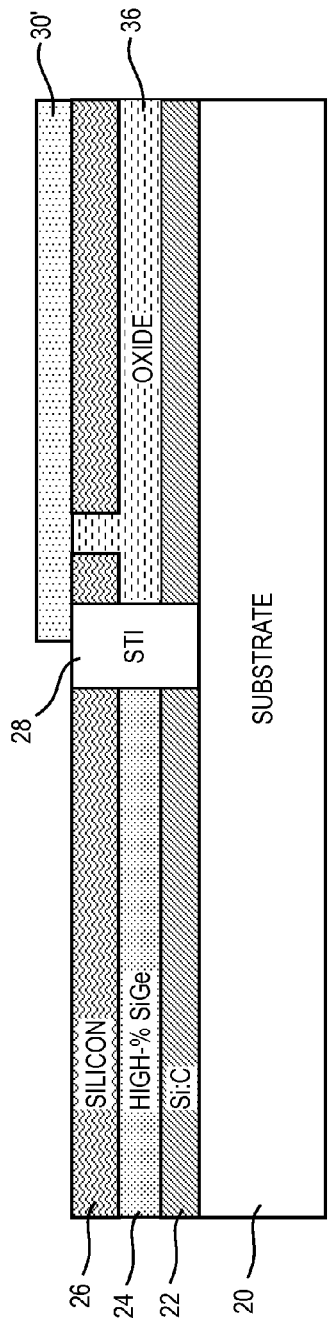
FIG. 10 is a schematic illustration showing formation of a hard mask over a portion of the structure shown in FIG. 9.

Referring to FIG. 9, the hard mask 30 is removed from the structure using hot phosphoric acid if the hard mask is a nitride mask, or other suitable technique. The space 34 formed by removal of the germanium containing layer 24 from the nFET region is filled with an oxide material 36 such as silicon dioxide. The filling process can be done by a deposition process (e.g., by CVD, spin-on, etc.) followed by an etch back process (e.g., wet etch, dry etch or combination of both) to remove oxide from areas other than the SON region. The thickness of the layer of oxide material will be substantially the same as the thickness of the germanium containing layer 24. A hard mask 30' is deposited on the resulting structure. A soft (for example, photoresist) mask (not shown) is deposited on the hard mask 30' to facilitate selective removal of the portion of the hard mask 30' on the pFET region of the structure. A structure resulting from such mask deposition and partial removal is shown in FIG. 10. The deposition and selective removal of hard and soft masks is familiar to those of skill in the art.

Figure 11:
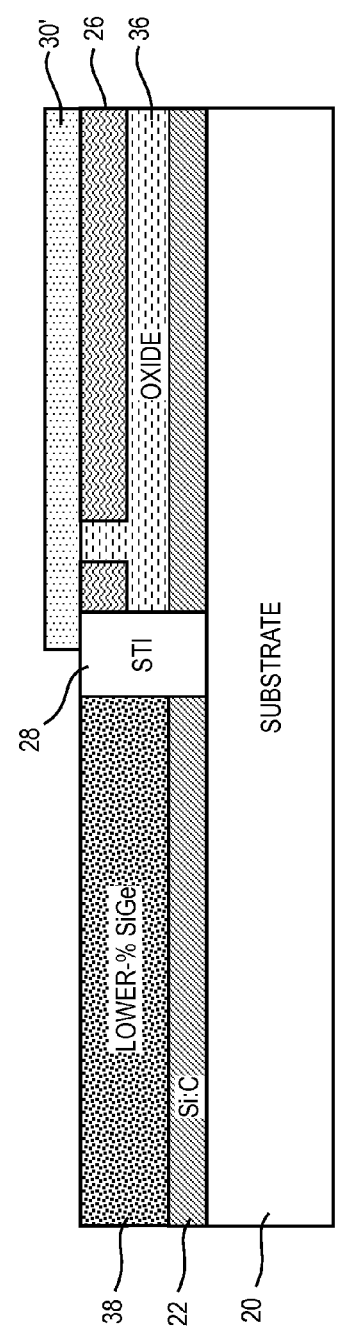
FIG. 11 is a schematic illustration showing formation of a silicon germanium layer from adjoining layers of silicon and silicon germanium.

Referring to FIG. 11, the structure obtained following the steps described above with respect to FIGS. 1-10 is thermally annealed. The anneal process can be furnace anneal, rapid thermal anneal, flash anneal, or any suitable combination of those processes. The anneal temperature ranges from 600 degrees to 1300 degrees Centigrade. The anneal time ranges from 1 millisecond to 2 hours, depending on the anneal temperature. Higher anneal temperatures require shorter anneal times. A typical anneal condition is about 30 minutes at 1000° C. Such annealing causes the mixing of the germanium containing layer 24 and the crystalline silicon layer 26 in the pFET region of the structure. A silicon germanium layer 38 is thereby formed on the carbon doped silicon layer 22. The resulting silicon germanium layer 38 will have a germanium content that is lower than that of the germanium containing layer 24. The germanium content of the silicon germanium layer 38 can be engineered as desired for particular applications by depositing a germanium containing layer 24 having an appropriate germanium content and/or thickness for the particular applications.

Figure 12:
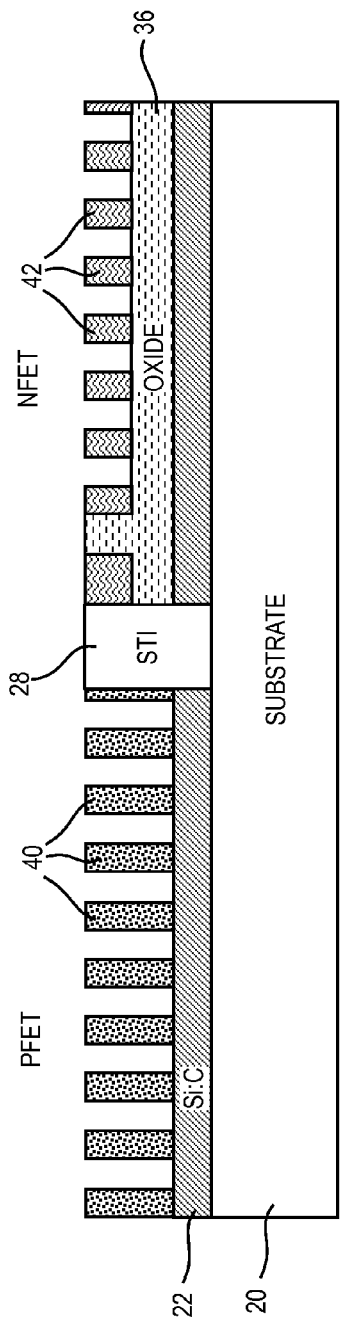
FIG. 12 shows the removal of the hard mask from the structure shown in FIG. 11 and formation of silicon and silicon germanium fins.

The second applied hard mask 30' is removed from the structure following the annealing process. Silicon germanium fins 40 are formed in the pFET region of the structure from the silicon germanium layer 38. Silicon fins 42 are formed from the silicon layer 26 in the nFET region of the structure 50. The pFET and nFET regions comprising the fins 40, 42 are electrically isolated by the STI region as shown in FIG. 12. Techniques for forming finned structures for use in FinFET devices are known to the art and continue to be developed. Sidewall image transfer (SIT) is one exemplary and conventional technique for defining fin thickness. US Pub. No. 2012/0068264, which is incorporated by reference herein, discloses other techniques for forming narrow fins on semiconductor substrates that can be applied to the structures disclosed herein. The carbon doped silicon layer 22 functions as an etch stop in the pFET region when the silicon germanium layer 38 is processed to form the fins 40.

Technology for forming pFET and nFET devices on finned structures is known and continues to be developed. The gates of FinFETs can be formed using a "gate-first" process wherein a gate stack and spacers are formed prior to selective epitaxial growth on the fins wherein source and drain regions are enlarged. A "gate-last" process may alternatively be employed. Gate-last procedures can involve making a dummy gate, fabricating other elements of the transistor, removing the dummy gate, and replacing the removed dummy gate with actual gate materials.

Doped semiconductor material such as silicon germanium (SiGe) may be provided by selective epitaxial growth on the sidewalls of the fin structure(s) during fabrication of FinFET devices. Such growth results in faceted structures that, in some cases, merge into a continuous volume.

If a gate-first process as described above is employed, gate materials may comprise a gate dielectric (e.g., high-k such as hafnium oxide) and a gate conductor (e.g., metal gate). Any suitable deposition technique can be used to deposit high-k and metal gate, including but not limited to atomic layer deposition, chemical vapor deposition, physical vapor deposition, sputtering, plating, etc. Gate material can be formed both above and between the fins in some embodiments or, alternatively, only between the fins. Dielectric spacers are formed around the gate structure. If a gate-last process is employed, a dummy gate (not shown) is formed wherein the dummy gate may comprise a dummy gate dielectric (e.g., oxide) covering fins and a dummy gate material (e.g., polysilicon) on top of the dummy gate dielectric. This dummy gate is removed in a later process familiar to those of skill in the art and a replacement metal gate composition is patterned at an appropriate stage of the transistor fabrication process. Fin heights, widths and spacing are further chosen in accordance with manufacturer preferences. Fin heights in some embodiments range between 10-50 nm. As discussed above, fin heights in the nFET region correspond to the thickness of the deposited silicon layer 26 from which they are formed. The side walls of the crystalline silicon fins 42 and silicon germanium fins 40 are (110) surfaces in one or more embodiments. The side walls of the fins 40, 42 may not be exactly vertical, and instead converge towards the tops of the fins. Surfaces described as (110) surfaces herein are at least close to being (110) surfaces but may or may not be exactly (110) surfaces.

Once obtaining the structure as described above with respect to FIG. 12 (or FIG. 13 as described below) and gate structures have been formed thereon, source/drain regions are formed on the fins by diffusion, implantation or other techniques familiar to those of skill in the art. In some embodiments, a layer (not shown) of doped material (for example, silicon germanium) may be grown epitaxially or otherwise deposited on the structure, causing the source/drain regions to be merged in some embodiments or form diamond-shaped, unmerged structures in other embodiments. In the fabrication of a pFET structure, boron-doped SiGe can be employed in one or more embodiments for the epitaxial growth of volumes (not shown) on the sidewalls of the silicon germanium fins 42. To fabricate nFET structures, volumes are formed with phosphorus-doped silicon (Si:P) in some embodiments. The doping can be chosen as desired for particular transistor applications. In one exemplary embodiment where the doped source/drain semiconductor material is SiGe, the dopant is boron in a concentration ranging 4-7e20 and the resulting FinFET structure is p-type. Further fabrication steps are performed, some of which depend on the particular FinFET structure to be obtained. Typically the grid comprising the parallel fins and gate structures are filled with a low k dielectric material. Depending on the type of gate processing employed (gate-first or gate-last), appropriate steps are also taken to complete gate fabrication.

Figure 13:
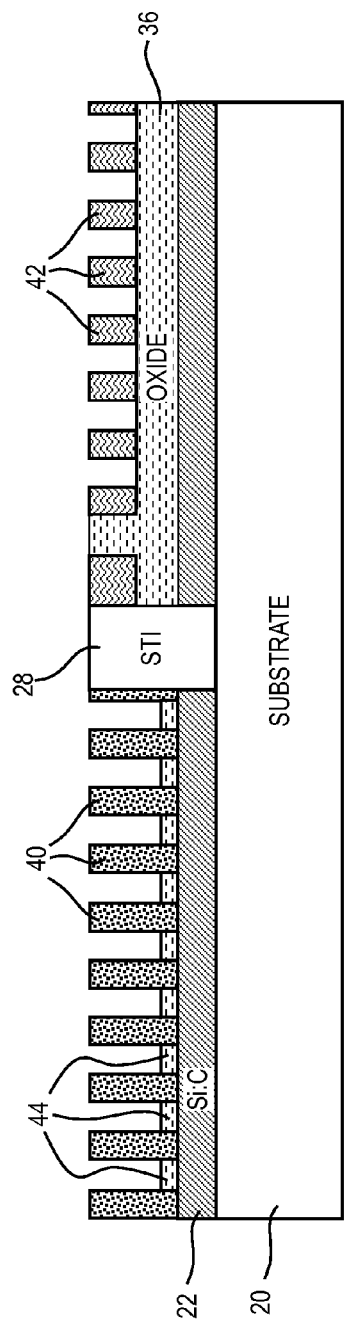
FIG. 13 is a schematic illustration showing the structure of FIG. 12 following deposition of an insulating material within channels formed by the silicon germanium fins.

Referring to FIG. 13, the areas between the silicon germanium fins 40 are filled with a dielectric material such as an oxide (for example silicon dioxide ($SiO_2$)), forming isolation regions 44. Such material can be deposited in accordance with conventional techniques such as high plasma density deposition. The thicknesses of the isolation regions 44 above the carbon doped silicon layer can be engineered by oxide fill, then CMP (chemical mechanical planarization) to the top of the gate nitride cap (not shown), and then timed recess RIE (reactive ion etch) to approximate the thickness of the oxide layer 36 in the nFET region, in which case the heights of the silicon germanium fins 40 above the isolation regions 44 would be substantially the same as the heights of the silicon fins 42 in the nFET region.

Given the discussion thus far and with reference to the exemplary embodiments discussed above and the drawings, it will be appreciated that, in general terms, an exemplary fabrication method includes obtaining a structure comprising a bulk silicon substrate, an epitaxial layer comprising carbon doped silicon on the substrate, an epitaxial layer containing germanium on the carbon doped silicon layer, and a layer comprising crystalline silicon on the germanium containing layer. Such as structure is illustrated in FIG. 4 and may be obtained by fabrication as described above or purchased at least in part from a vendor. The method further includes forming an isolation region on the structure electrically isolating a first region of the structure from a second region of the structure. As shown in FIG. 5, a shallow trench isolation region 28 is formed to electrically isolate first and second regions of the structure later used to form pFET and nFET devices. The germanium containing layer is removed from the second region of the structure, thereby forming a space within the second region beneath the crystalline silicon layer. As discussed above, the second region is later used to form an nFET device. An insulating layer such as an oxide layer 36 is formed within the space. The method further includes thermally mixing the germanium containing layer and the crystalline silicon layer in the first region of the structure to form a layer comprising silicon germanium. A plurality of fins comprising silicon germanium are formed in the first region from the silicon germanium layer. Crystalline silicon fins are formed from the silicon layer in the second region. It will be appreciated that at least some of the above-referenced steps may not necessarily be performed in the same sequence described above. As discussed above, the germanium containing layer comprises silicon germanium in one or more embodiments.

A further exemplary fabrication method includes depositing an epitaxial carbon doped silicon layer 22 on an essentially undoped silicon substrate 20, depositing an epitaxial silicon germanium layer on the carbon doped silicon layer, and depositing an essentially undoped epitaxial silicon layer 26 on the silicon germanium layer, thereby forming a first structure, such as shown in FIG. 4, comprising the silicon substrate, the carbon doped silicon layer, the silicon germanium layer and the epitaxial silicon layer. A shallow trench isolation region 28 is formed within the first structure. The silicon germanium layer 24 on a first side of the shallow trench isolation region is removed, thereby forming a space 34 within the first structure beneath the epitaxial silicon layer 26. The space is filled with an electrically insulating material as shown in FIG. 9. The method further includes the step of thermally mixing the silicon germanium layer and the epitaxial silicon layer on a second side of the shallow trench isolation region, thereby forming a silicon germanium surface layer 38. A first set of parallel fins 42 is formed from the epitaxial silicon layer on the first side of the shallow trench isolation region and a second set of parallel fins 40 is formed from the silicon germanium surface layer on the second side of the shallow trench isolation region 28. FinFET devices (not shown) can be formed on the resulting structure.

A structure provided in accordance with the disclosure includes bulk silicon germanium fins for use in association with one or more pFET devices and silicon on insulator fins used in nFET devices. The structure is in wafer form in one or more embodiments. An epitaxial carbon doped silicon layer 22 is present on bulk silicon substrate 20. Fins 40 comprising silicon germanium adjoin a first portion of the epitaxial carbon doped silicon layer 22. An insulating layer 36 adjoins a second portion of the epitaxial carbon doped silicon layer. The insulating layer is an oxide layer in one or more embodiments and adjoins the top surface of the Si:C layer. A plurality of fins 42 comprising crystalline silicon adjoin the insulating layer. An isolation region 28 electrically isolates the first and second portions of the epitaxial carbon doped silicon layer 22. Such an exemplary structure is shown schematically in FIG. 12. In some embodiments, the structure further includes an isolation layer 44 extending between the silicon germanium fins 40 as shown in FIG. 13.

Those skilled in the art will appreciate that the exemplary structures discussed above can be distributed in raw form or incorporated as parts of intermediate products or end products that benefit from having FinFET devices therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
    obtaining a structure comprising a bulk silicon substrate, an epitaxial layer comprising carbon doped silicon on the substrate, an epitaxial layer containing germanium on the carbon doped silicon layer, and a layer comprising crystalline silicon on the epitaxial layer containing germanium;
    forming an isolation region on the structure electrically isolating a first region of the structure from a second region of the structure;
    removing the epitaxial layer containing germanium from the second region of the structure, thereby forming a space within the second region beneath the layer comprising crystalline silicon;
    forming an insulating layer within the space;
    thermally mixing the epitaxial layer containing germanium and the layer comprising crystalline silicon in the first region of the structure to form a layer comprising silicon germanium;
    forming a plurality of fins comprising silicon germanium in the first region from the silicon germanium layer, and
    forming a second plurality of fins from the layer comprising crystalline silicon in the second region.

2. The method of claim 1, wherein the layer comprising crystalline silicon has a thickness of fifty nanometers or less.

3. The method of claim 2, wherein the epitaxial layer containing germanium comprises silicon germanium.

4. The method of claim 3, wherein the step of forming the insulating layer within the space includes filling the space with an oxide material.

5. The method of claim 3, wherein the epitaxial layer containing germanium comprises 20-80% germanium.

6. The method of claim 5, wherein the epitaxial layer containing germanium has a thickness between five and twenty nanometers.

7. The method of claim 1, further including the step of forming gate structures on the structure.

8. The method of claim 1, further including the step of forming a p-type FinFET device in the first region using the silicon germanium fins.

9. The method of claim 8, further including the step of forming a n-type FinFET device in the second region using the fins formed from the layer comprising crystalline silicon.

10. The method of claim 9, wherein the step of removing the epitaxial layer containing germanium from the second region of the structure includes forming a trench through the layer comprising crystalline silicon and etching the epitaxial layer containing germanium.

* * * * *